United States Patent
Itou et al.

(10) Patent No.: US 9,933,558 B2
(45) Date of Patent: Apr. 3, 2018

(54) ILLUMINATION DEVICE COMPRISING FIRST, SECOND, AND THIRD REFLECTORS, A LIGHTGUIDE, AND A LIGHT-EMITTING LAYER AND DISPLAY DEVICE

(71) Applicant: Japan Display Inc., Minato-ku (JP)

(72) Inventors: Osamu Itou, Tokyo (JP); Eri Sasaki, Tokyo (JP)

(73) Assignee: Japan Display Inc., Minato-ku (JP)

( * ) Notice: Subject to any disclaimer, the term of this patent is extended or adjusted under 35 U.S.C. 154(b) by 0 days.

(21) Appl. No.: 15/381,645

(22) Filed: Dec. 16, 2016

(65) Prior Publication Data

US 2017/0176668 A1 Jun. 22, 2017

(30) Foreign Application Priority Data

Dec. 21, 2015 (JP) .................................. 2015-248556

(51) Int. Cl.
| | |
|---|---|
| F21V 8/00 | (2006.01) |
| G02F 1/1333 | (2006.01) |
| G02F 1/1343 | (2006.01) |
| G02F 1/1368 | (2006.01) |
| H01L 51/52 | (2006.01) |

(52) U.S. Cl.
CPC ......... *G02B 6/0055* (2013.01); *G02B 6/0051* (2013.01); *G02F 1/1368* (2013.01); *G02F 1/133345* (2013.01); *G02F 1/134309* (2013.01); *G02F 2201/123* (2013.01); *H01L 51/5271* (2013.01)

(58) Field of Classification Search
CPC .......................... H01L 51/5271; G02B 6/0051
See application file for complete search history.

(56) References Cited

U.S. PATENT DOCUMENTS

| | | | |
|---|---|---|---|
| 2006/0164862 A1* | 7/2006 | Chien ................. | G02B 6/0038 362/619 |
| 2006/0250542 A1* | 11/2006 | Liu ........................ | G02B 6/002 349/61 |
| 2008/0297459 A1* | 12/2008 | Sugimoto ............... | G02B 5/09 345/102 |
| 2014/0022816 A1* | 1/2014 | Iwasaki ................ | G02B 6/0041 362/606 |
| 2014/0146563 A1* | 5/2014 | Watanabe ............ | G02B 6/0043 362/606 |

(Continued)

FOREIGN PATENT DOCUMENTS

JP 2013-254071 12/2013

*Primary Examiner* — Paul Lee
(74) *Attorney, Agent, or Firm* — Oblon, McClelland, Maier & Neustadt, L.L.P.

(57) ABSTRACT

According to one embodiment, an illumination device includes a lightguide, a light-emitting layer, a first reflector, a second reflector, and a third reflector. A distance between the first reflector and the second reflector is greater at a second position farther from the light-emitting layer than at a first position closer to the light-emitting layer. A distance between the lightguide and the third reflector is greater at a fourth position farther from the first reflector than at a third position closer to the first reflector. An emission portion for allowing emission of light emitted from the light-emitting layer is formed between the second reflector and the third reflector.

20 Claims, 15 Drawing Sheets

(56) References Cited

U.S. PATENT DOCUMENTS

2014/0168575 A1* 6/2014 Wu .................. G02F 1/133514
    349/65
2014/0265928 A1* 9/2014 Wagner ................ G09G 3/3413
    315/297

* cited by examiner

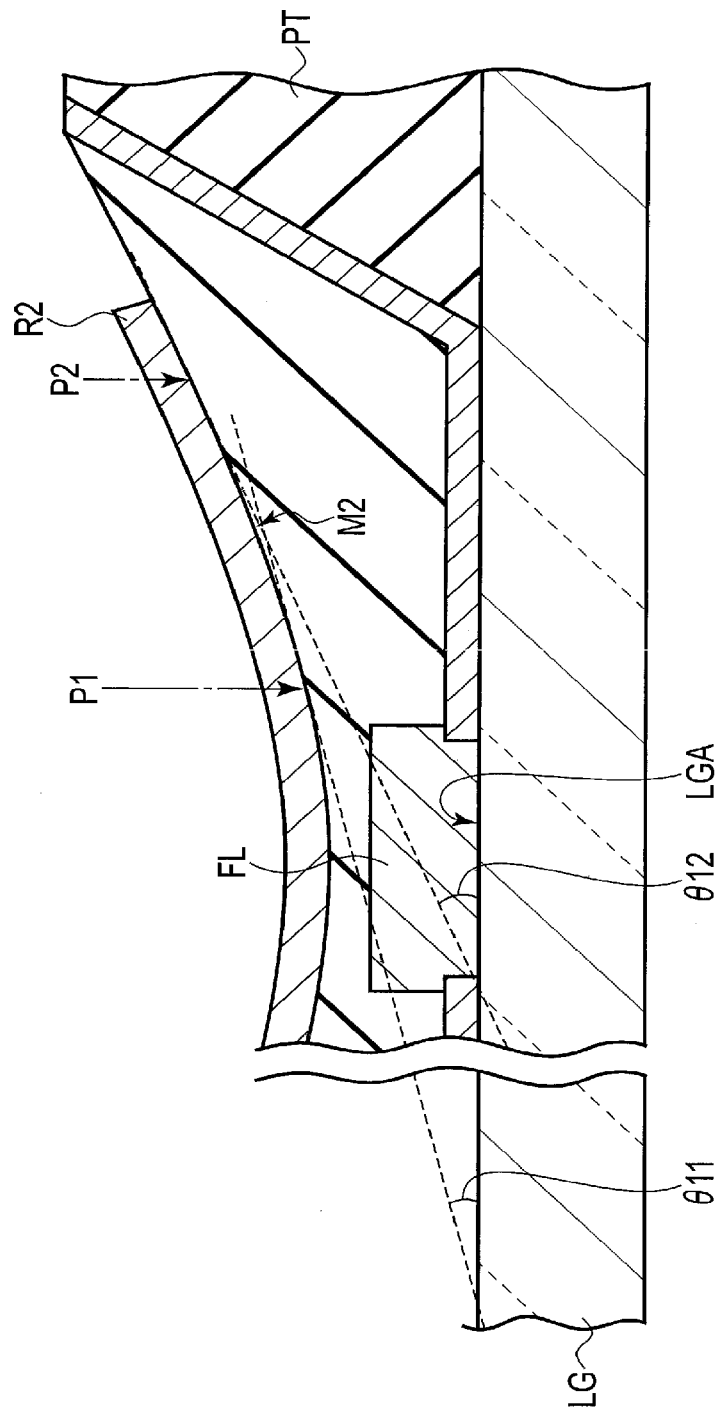
F I G. 6

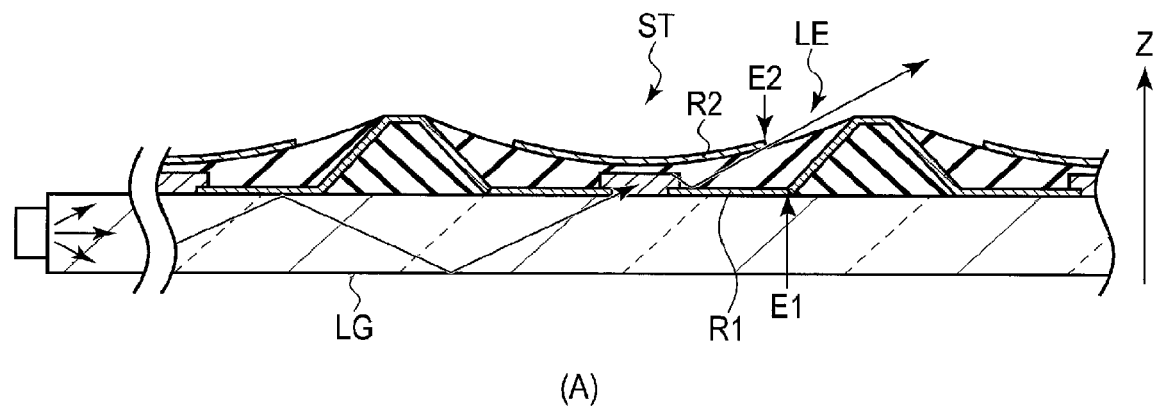
(A)
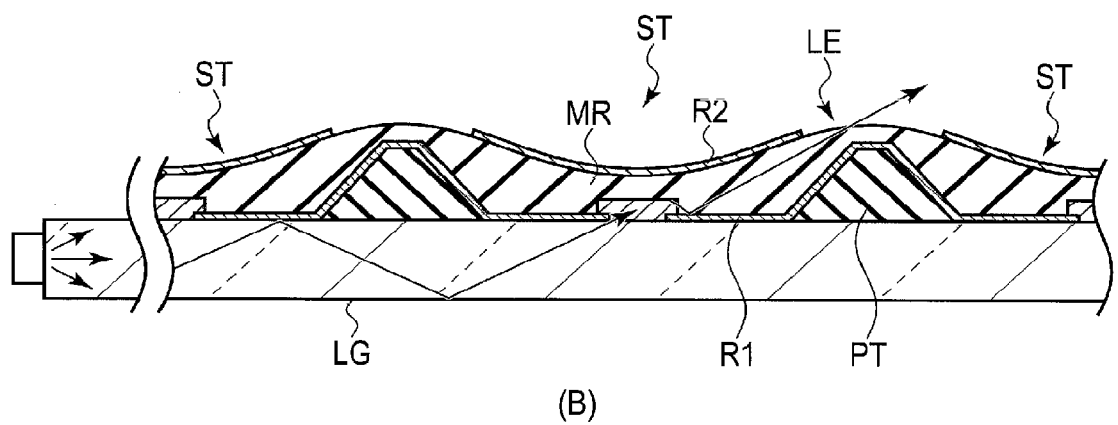
(B)
F I G. 9

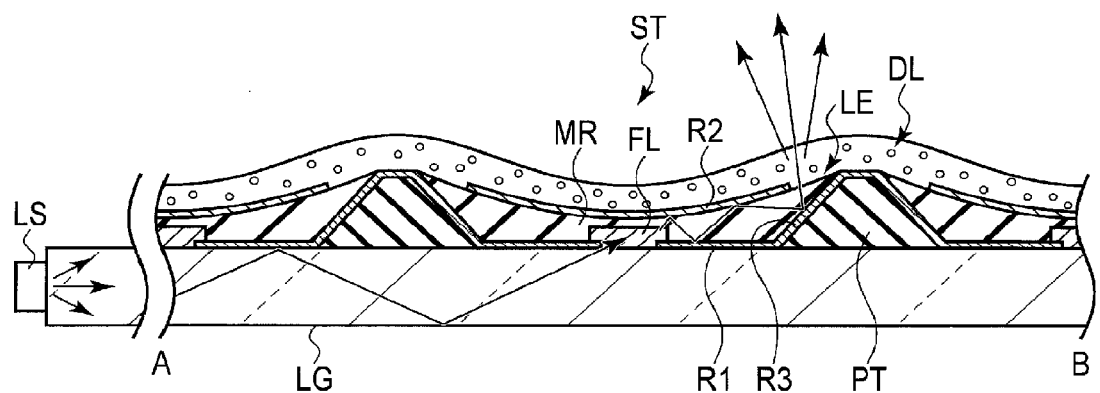
F I G. 12
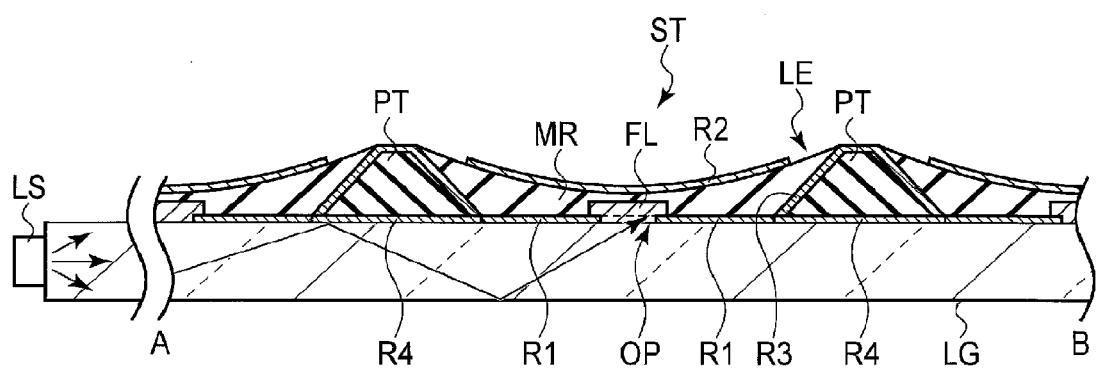
F I G. 13

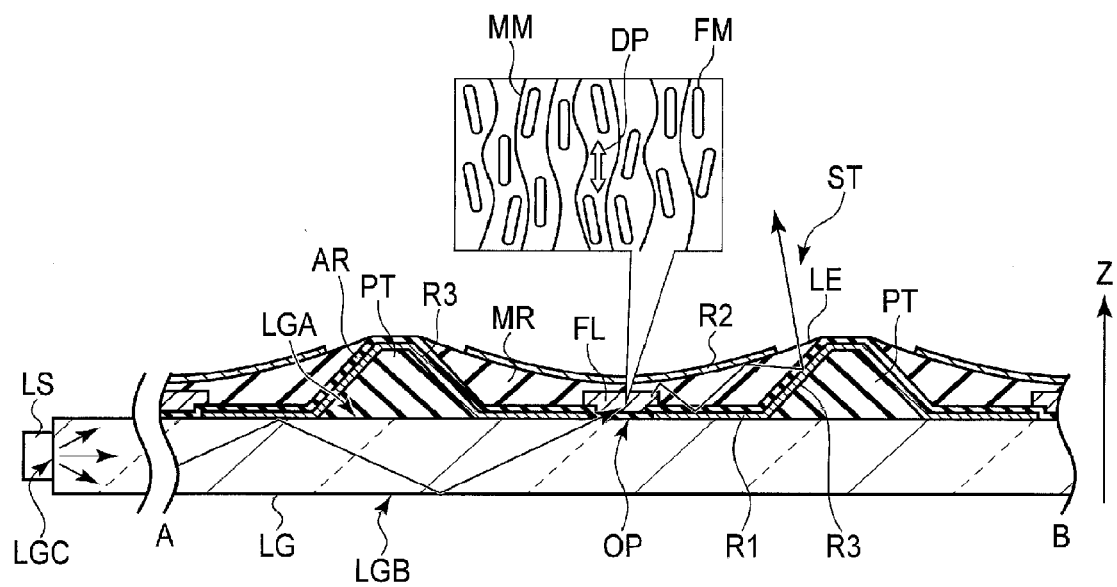
F I G. 14
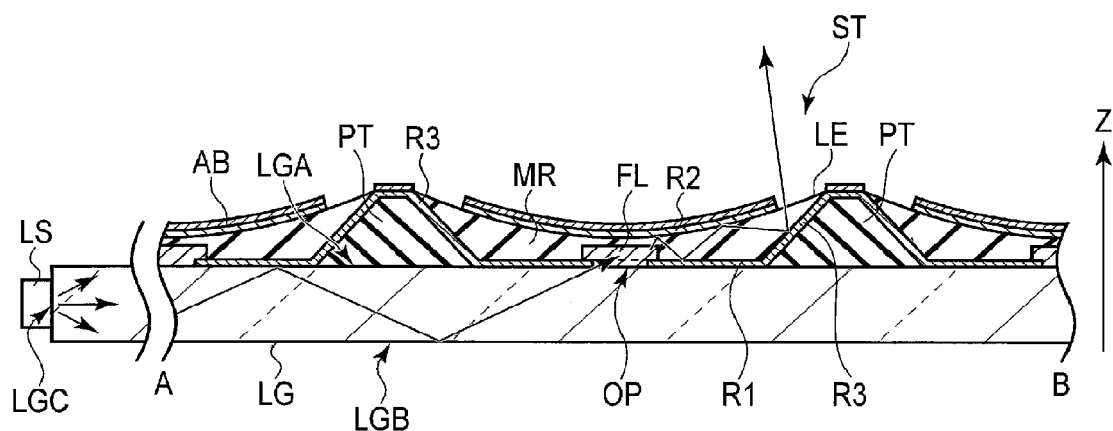
F I G. 15

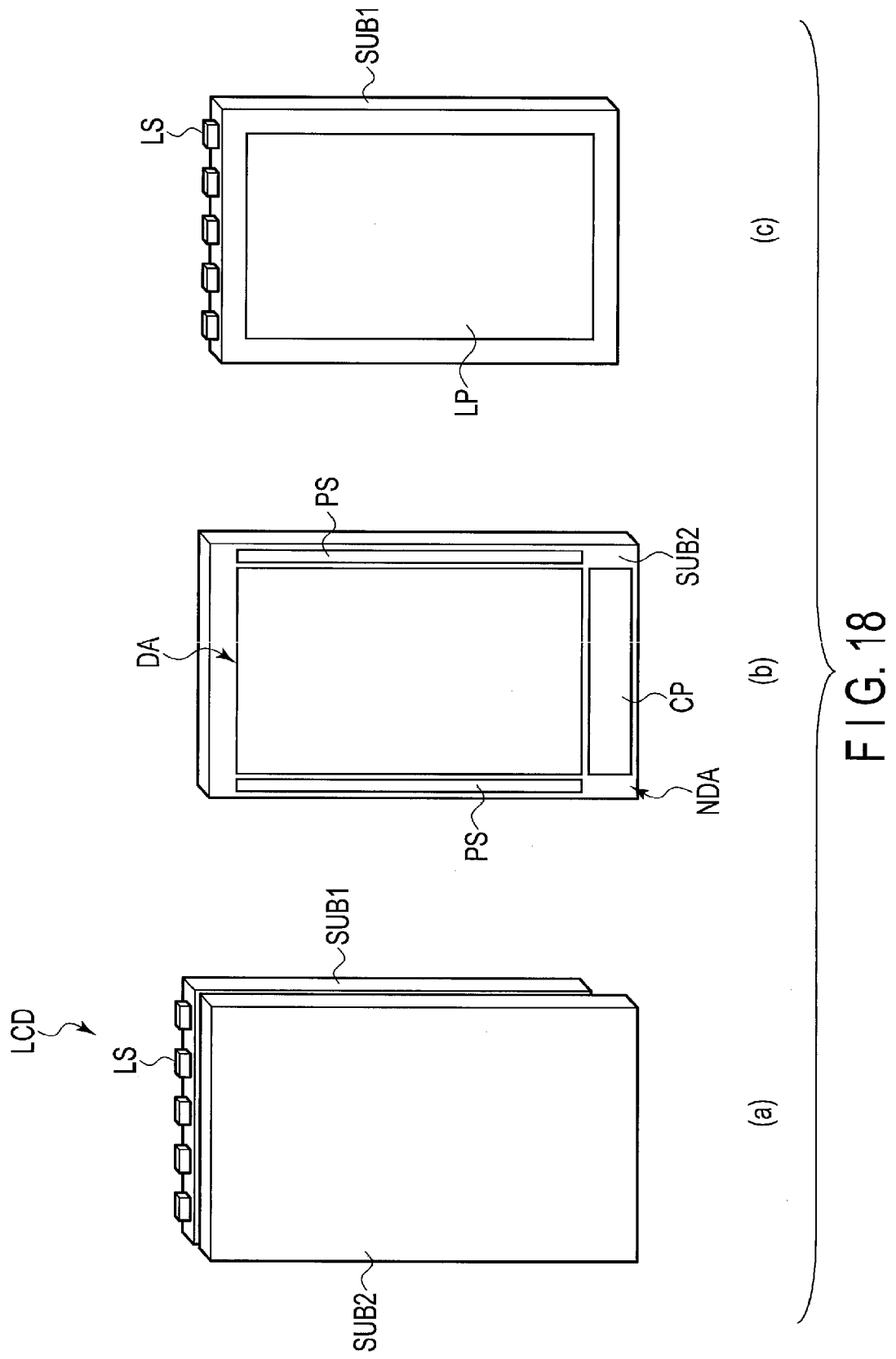
F I G. 18

ILLUMINATION DEVICE COMPRISING FIRST, SECOND, AND THIRD REFLECTORS, A LIGHTGUIDE, AND A LIGHT-EMITTING LAYER AND DISPLAY DEVICE

CROSS-REFERENCE TO RELATED APPLICATIONS

This application is based upon and claims the benefit of priority from Japanese Patent Application No. 2015-248556, filed Dec. 21, 2015, the entire contents of which are incorporated herein by reference.

FIELD

Embodiments described herein relate generally to an illumination device and a display device.

BACKGROUND

Currently, the mainstream liquid crystal display device comprises a white light source and a color filter, and color display is realized by light which has passed through the color filter. In such a liquid crystal display device, since the color filter absorbs approximately 70% of light from the light source, improvement of the efficiency of use of light and reduction of the power consumption of the light source are required.

Recently, a phosphor substrate and a display device using fluorescence produced by excitation light for display without using a color filter have been proposed. The display device includes, in one example, a light source, a phosphor substrate, and a display panel arranged between the light source and the phosphor substrate. The phosphor substrate includes a light transmissive substrate, a phosphor layer and a reflective layer stacked in order on a surface of the substrate, and a barrier which partition the phosphor layer between the substrate and the reflective layer.

BRIEF DESCRIPTION OF THE DRAWINGS

FIG. 6 is an illustration for explaining an example of a first angle of inclination which the second reflector R2 forms with a lightguide LG in the cross-sectional view shown in FIG. 4.

FIG. 9 shows cross-sectional views each showing a structure ST of a comparative example.

FIG. 12 is a cross-sectional view showing another structure example of the structure ST shown in FIG. 2 taken along line A-B.

FIG. 13 is a cross-sectional view showing yet another structure example of the structure ST shown in FIG. 2 taken along line A-B.

FIG. 14 is a cross-sectional view showing yet another structure example of the structure ST shown in FIG. 2 taken along line A-B.

FIG. 15 is a cross-sectional view showing yet another structure example of the structure ST shown in FIG. 2 taken along line A-B.

FIG. 18 is a perspective view showing an example of a structure of a liquid crystal device LCD of the present embodiment.

DETAILED DESCRIPTION

Figure 1:
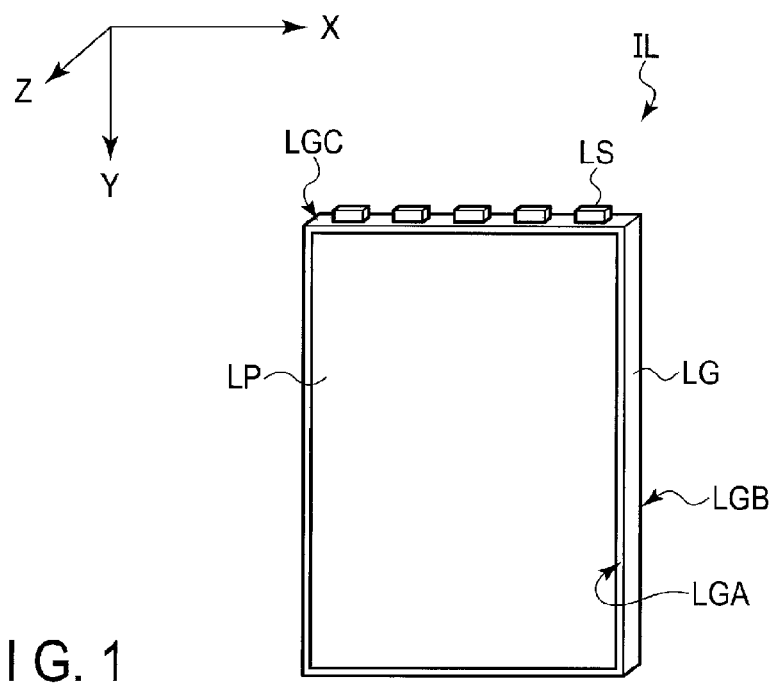
FIG. 1 is a perspective view showing an example of a structure of the outer appearance of an illumination device IL.

In general, according to one embodiment, an illumination device includes: a light source; a lightguide which includes an upper surface, and guides the light from the light source; a light-emitting layer which is disposed on the upper surface, and emits light based on the light from the light source; a first reflector disposed on the upper surface; a second reflector located above the first reflector and the light-emitting layer at an interval; and a third reflector which is located above the upper surface, and is more separated from the light-emitting layer than the first reflector, a distance between the first reflector and the second reflector being greater at a second position farther from the light-emitting layer than at a first position closer to the light-emitting layer, a distance between the lightguide and the third reflector being greater at a fourth position farther from the first reflector than at a third position closer to the first reflector, an emission portion for allowing emission of light emitted from the light-emitting layer being formed between the second reflector and the third reflector.

According to another embodiment, a display device includes: an insulating film; a light-emitting element disposed on the insulating film; a first reflector disposed on the insulating film; a second reflector located above the first reflector and the light-emitting element at an interval; and a third reflector which is located above the insulating film, and is more separated from the light-emitting element than the first reflector, a distance between the first reflector and the second reflector being greater at a second position farther from the light-emitting element than at a first position closer to the light-emitting element, a distance between the insulating film and the third reflector being greater at a fourth position farther from the first reflector than at a third position closer to the first reflector, an emission portion for allowing emission of light emitted from the light-emitting element being formed between the second reflector and the third reflector.

According to yet another embodiment, a display device includes: a light source; a first substrate comprising a lightguide which includes an upper surface, and guides light from the light source, a light-emitting layer which is disposed on the upper surface, and emits light based on the light from the light source, a first reflector disposed on the upper surface, a second reflector located above the first reflector and the light-emitting layer at an interval, and a third reflector which is located above the upper surface, and is more separated from the light-emitting layer than the first reflector; a liquid crystal layer disposed on the first substrate; and a second substrate disposed on the liquid crystal layer, wherein a distance between the first reflector and the second reflector being greater at a second position farther from the light-emitting layer than at a first position closer to the light-emitting layer, a distance between the lightguide and the third reflector being greater at a fourth position farther from the first reflector than at a third position closer to the first reflector, an emission portion for allowing emission of light emitted from the light-emitting layer being formed between the second reflector and the third reflector.

Embodiments will be described hereinafter with reference to the accompanying drawings. The disclosure is merely an example, and proper changes within the spirit of the invention, which are easily conceivable by a skilled person, are included in the scope of the invention as a matter of course. In addition, in some cases, in order to make the description clearer, the widths, thicknesses, shapes, etc., of the respective parts are schematically illustrated in the drawings, compared to the actual modes. However, the schematic illustration is merely an example, and adds no restrictions to the interpretation of the invention. Besides, in the specification and drawings, the structural elements, which have functions identical or similar to the functions described in connection with preceding drawings, are denoted by the same reference numbers, and a duplicated detailed description thereof may be arbitrarily omitted.

FIG. 1 is a perspective view showing an example of a structure of the outer appearance of an illumination device IL. Note that in the drawing, a first direction X and a second direction Y are directions orthogonal to each other, and a third direction Z is a direction orthogonal to the first direction X and the second direction Y. In the present specification, a direction toward a pointing end of an arrow indicating the third direction Z is referred to as upward (or merely above), and a direction toward the opposite side from the pointing end of the arrow is referred to as downward (or merely below). Further, a view from the pointing end of the arrow indicating the third direction Z to an X-Y plane defined by the first direction X and the second direction Y is called a planar view.

The illumination device IL comprises a light source LS, a lightguide LG, and a light radiation portion LP. The light source LS is an excitation light source which emits excitation light which will be described later, and is a light-emitting diode in one example, but may be the other light-emitting elements such as a semiconductor laser. Light which is emitted from the light source LS is monochromatic light or light having a peak intensity in a single-frequency. In one example, such light is blue light, but may be ultraviolet light.

The lightguide LG is to guide the light emitted from the light source LS, and is formed as a flat plate. More specifically, the lightguide LG includes an upper surface LGA and a lower surface LGB parallel to the X-Y plane, and a side surface LGC parallel to an X-Z plane. In one example, each of the upper surface LGA and the lower surface LGB is formed in a rectangular shape having a pair of short sides parallel to the first direction X and a pair of long sides parallel to the second direction Y. The side surface LGC is formed in a rectangular shape having a pair of long sides parallel to the first direction X and a pair of short sides parallel to the third direction Z. Note that the shapes of the upper surface LGA, the lower surface LGB, and the side surface LGC are not limited to the illustrated example. They may be formed in any other polygonal shape, or formed to be circular or elliptical. A plurality of light sources LS are arranged in the first direction X and are disposed on the side surface LGC.

The light radiation portion LP is provided on the upper surface LGA. As will be described later, the light radiation portion LP is composed of a plurality of structures. In the illumination device IL, a surface on which the light radiation portion LP is provided serves as a light-emitting surface. Further, in the example illustrated in FIG. 1, although the light radiation portion LP is provided on only the upper surface LGA of the lightguide LG, the light radiation portion LP can be provided on both of the upper surface LGA and the lower surface LGB of the lightguide LG, whereby an illumination device IL capable of emitting light from both sides can be provided.

Figure 2:
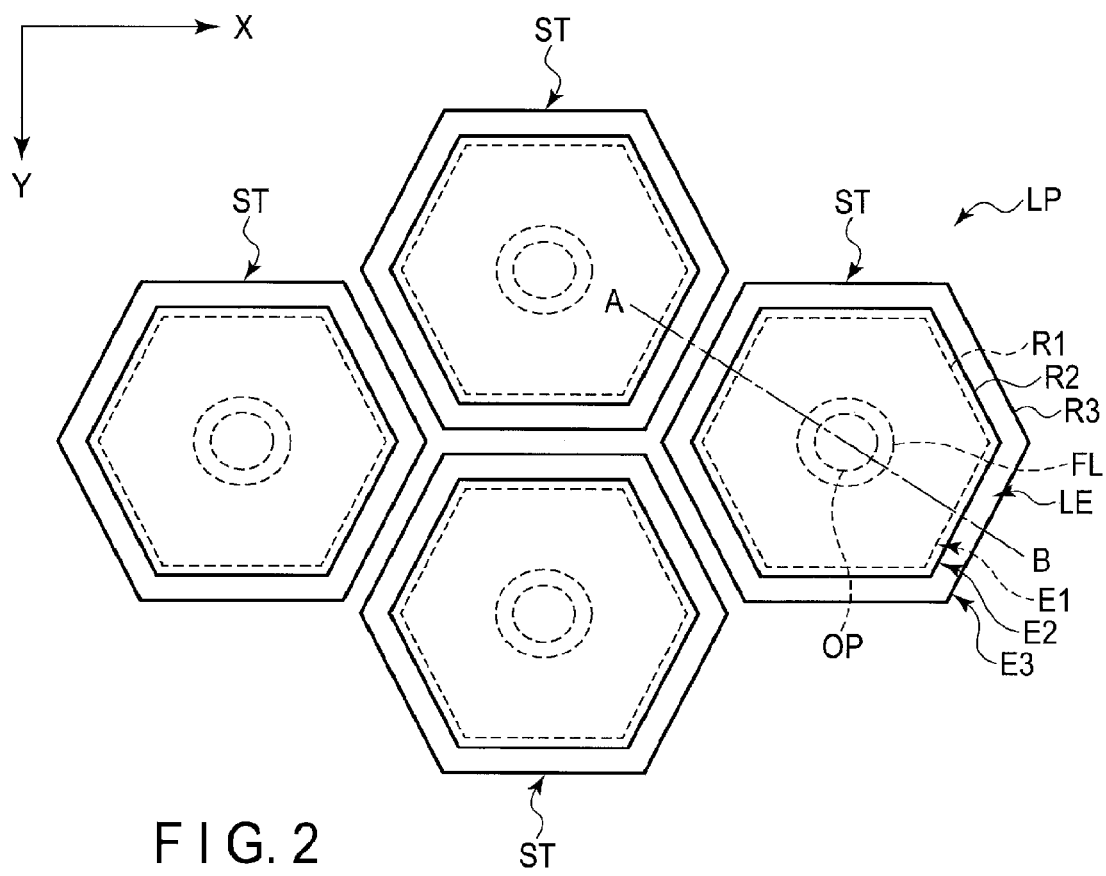
FIG. 2 is a plan view showing a structure example of a structure ST which constitutes a light radiation portion LP shown in FIG. 1.

FIG. 2 is a plan view showing a structure example of a structure ST which constitutes the light radiation portion LP shown in FIG. 1.

A plurality of structures ST are arranged in the X-Y plane. In the example illustrated, each of the structures ST is formed to be hexagonal in the X-Y plane. The structure ST includes a first reflector R1, a second reflector R2, a third reflector R3, and a light-emitting layer FL. The first reflector R1 includes a first end portion E1 which is hexagonal, and also includes an opening OP at the central portion. In the example illustrated, the opening OP is formed to be circular. The light-emitting layer FL is positioned in the opening OP. In the example illustrated, the light-emitting layer FL is positioned at substantially the center of the structure ST. The second reflector R2 includes a second end portion E2 which is hexagonal, and overlaps the first reflector R1 and the light-emitting layer FL in the planar view. The second end portion E2 is positioned on the outer side of the first end portion E1, that is, the side separated from the light-emitting layer FL. The third reflector R3 is positioned on the outer side of the first reflector R1, and includes a third end portion E3 which is hexagonal. In the third reflector R3, a portion close to the first end portion E1 overlaps the second reflector R2. The third end portion E3 is positioned even further to the outside of the second end portion E2. An emission portion LE is formed between the second end portion E2 and the third end portion E3.

Figure 3:
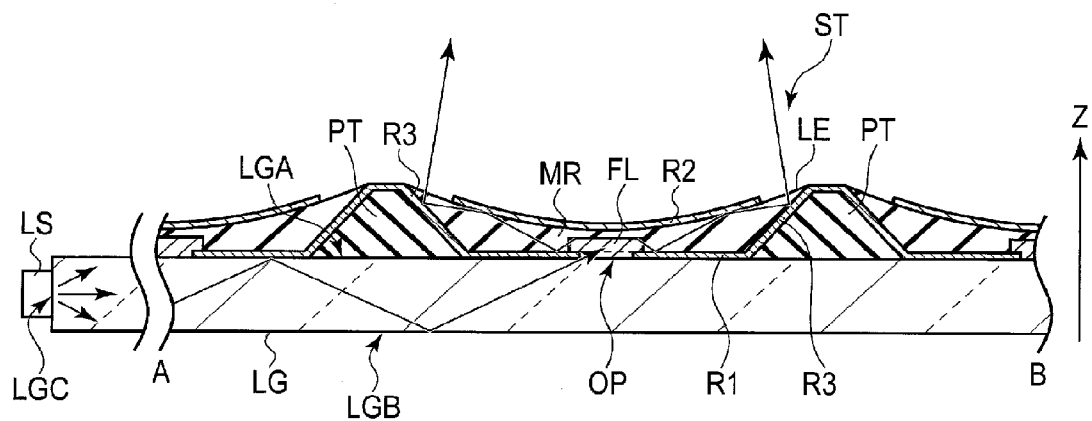
FIG. 3 is a cross-sectional view showing a structure example of the structure ST shown in FIG. 2 taken along line A-B.

FIG. 3 is a cross-sectional view showing a structure example of the structure ST shown in FIG. 2 taken along line A-B.

The structure ST further includes a projection PT and an optical propagation layer MR. The first reflector R1, the light-emitting layer FL, and the projection PT are all located on the upper surface LGA of the lightguide LG. In the example illustrated, although the first reflector R1, the light-emitting layer FL, and the projection PT are all in contact with the upper surface LGA, another layer may be disposed between those elements and the upper surface LGA. The light-emitting layer FL emits light by the light from the light source LS, and is arranged such that it blocks the opening OP. The projection PT has a substantially trapezoidal cross-section. The second reflector R2 is located above the first reflector R1 and the light-emitting layer FL at an interval. The third reflector R3 is disposed above the upper surface LGA, and is connected to the first reflector R1. The optical propagation layer MR is disposed from the central portion of the structure ST (a region near the light-emitting layer FL) to a peripheral portion of the same (a region near the projection PT), and is located above each of the first reflector R1, the light-emitting layer FL, and the third reflector R3, and below the second reflector R2. Also, the optical propagation layer MR is disposed in the emission portion LE between the second reflector R2 and the third reflector R3. The first reflector R1 is parallel to the upper surface LGA. The second reflector R2 and the third reflector R3 are both not parallel to the upper surface LGA.

The lightguide LG is formed of glass such as borosilicate glass, or resin such as plastic.

Each of the first reflector R1, the second reflector R2, and the third reflector R3 is formed of metal such as aluminum, silver, or titanium, and has a film thickness of approximately 100 nm, in one example.

The projection PT and the optical propagation layer MR are formed of transparent resin such as acrylic resin. The light-emitting layer FL is formed of resin in which an emitting material is mixed. Here, the emitting material is a wavelength conversion material such as phosphors, quantum dots, and quantum rods. Although both a positive and negative photoresist can be used for the projection PT, the optical propagation layer MR, and the light-emitting layer FL, a positive photoresist is used in this embodiment placing importance on shape workability.

Note that although the light sources LS are arranged to face the side surface LGC, as long as the light emitted from the light sources LS is configured to be incident on the side surface LGC, the structure is not limited to this example.

Figure 4:
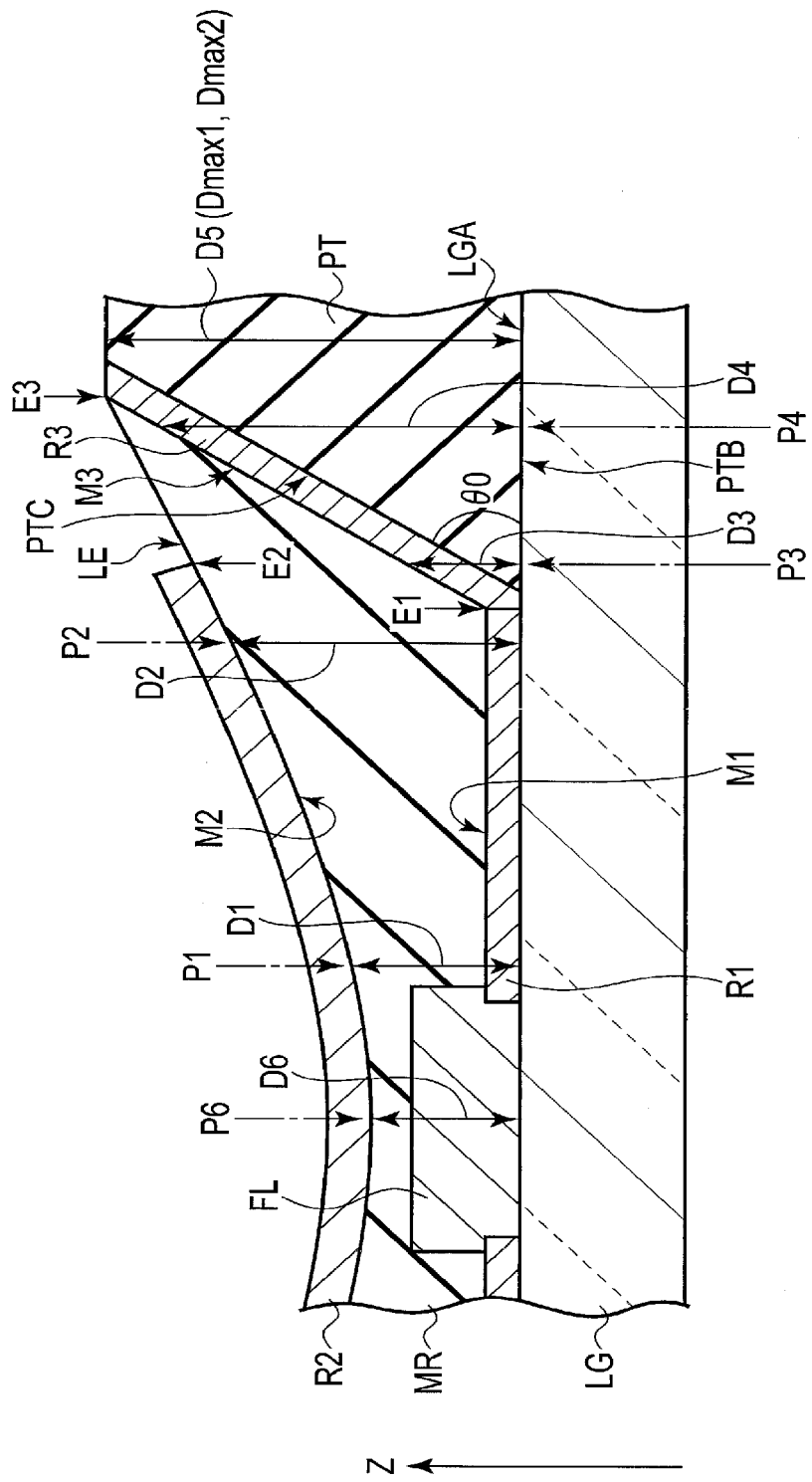
FIG. 4 is a cross-sectional view showing a part of the structure ST shown in FIG. 3 in an enlarged scale.

FIG. 4 is a cross-sectional view showing a part of the structure ST shown in FIG. 3 in an enlarged scale.

The projection PT includes a lower surface PTB which is in contact with the upper surface LGA, and a side surface PTC on which the third reflector R3 is arranged. The side surface PTC is an inclined surface. Angle θ0 formed between the lower surface PTB and the side surface PTC is an acute angle of less than 90 degrees, and is, for example, approximately 45 degrees.

The first reflector R1, the second reflector R2, and the third reflector R3 have reflective surfaces M1, M2, and M3 which are in contact with the optical propagation layer MR, respectively. The emission portion LE is located immediately above the reflective surface M3.

First, a distance between the first reflector R1 and the second reflector R2 will be described. In a region in which the first reflector R1 and the second reflector R2 face each other with the optical propagation layer MR interposed therebetween, a first distance D1 is formed at a first position P1 close to the light-emitting layer FL, and a second distance D2 is formed at a second position P2 which is separated from the light-emitting layer FL. The second distance D2 is greater than the first distance D1. The first distance D1 and the second distance D2 in this case correspond to lengths between the reflective surfaces M1 and M2 along the third direction Z. A film thickness of the optical propagation layer MR located between the first reflector R1 and the second reflector R2 is gradually increased from the side close to the light-emitting layer FL to the side close to the projection PT.

Next, a distance between the lightguide LG and the third reflector R3 will be described. In a region in which the lightguide LG and the third reflector R3 face each other with the projection PT interposed therebetween, a third distance D3 is formed at a third position P3 close to the first reflector R1, and a fourth distance D4 is formed at a fourth position P4 which is separated from the first reflector R1. The fourth distance D4 is greater than the third distance D3. The third distance D3 and the fourth distance D4 in this case correspond to lengths between the upper surface LGA and the reflective surface M3 along the third direction Z.

Next, a positional relationship between the first end portion E1 and the second end portion E2 will be described. The second end portion E2 is located directly above the first end portion E1, or on the outer side as compared to a position directly above the first end portion E1. In the example illustrated, the second end portion E2 is located on the outer side of the first end portion E1.

Next, the relationship between heights of the optical propagation layer MR and the third reflector R3 will be described. A maximum distance Dmax1 between the lightguide LG and the optical propagation layer MR is less than or equal to a maximum distance Dmax2 between the lightguide LG and the third reflector R3. Here, the maximum distances Dmax1 and Dmax2 correspond to lengths from the upper surface LGA along the third direction Z. The example illustrated corresponds to a case where the maximum distance Dmax1 is equal to the maximum distance Dmax2, and both of the two are represented as distance D5.

Next, a distance between the lightguide LG and the second reflector R2 will be described. In a region in which the light-emitting layer FL and the second reflector R2 face each other with the optical propagation layer MR interposed therebetween, position P6 at which distance D6 between the lightguide LG and the second reflector R2 becomes the smallest exists. Distance D6 in this case corresponds to a length between the upper surface LGA and the reflective surface M2 along the third direction Z.

Figure 5:
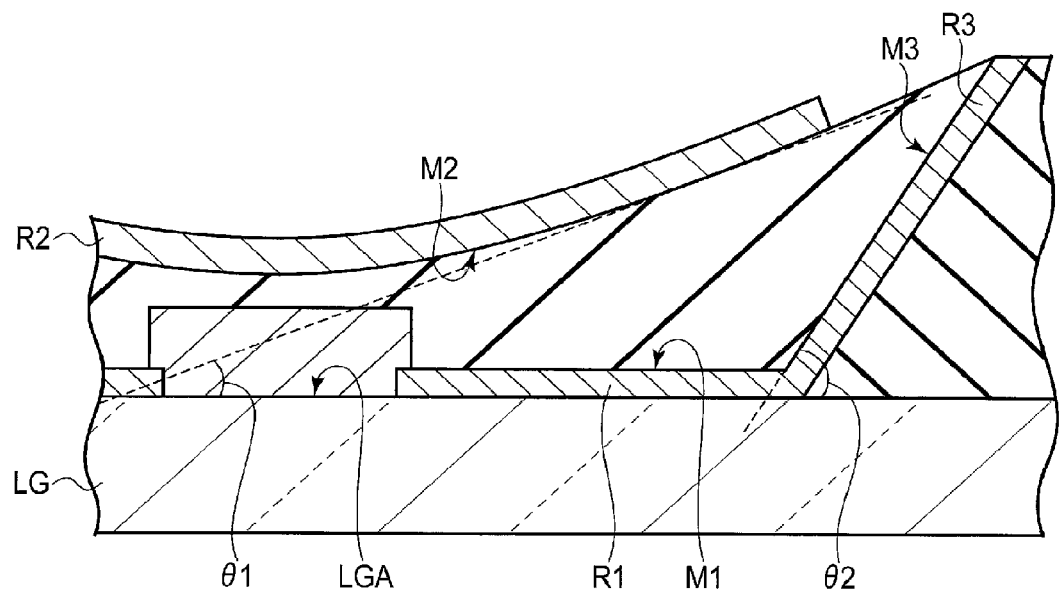
FIG. 5 is an illustration for explaining an angle of inclination of each of a second reflector R2 and a third reflector R3 in the cross-sectional view shown in FIG. 4.

FIG. 5 is an illustration for explaining an angle of inclination of each of the second reflector R2 and the third reflector R3 in the cross-sectional view shown in FIG. 4.

The second reflector R2 and the third reflector R3 are inclined with respect to the upper surface LGA. A first angle of inclination θ1 which the second reflector R2 forms with the upper surface LGA is smaller than a second angle of inclination θ2 which the third reflector R3 forms with the upper surface LGA. Each of the first angle of inclination θ1 and the second angle of inclination θ2 is an acute angle less than 90 degrees. The first angle of inclination θ1 intended here is an angle formed between the reflective surface M2 and the upper surface LGA, and when a cross-section of the reflective surface M2 is curved, the first angle of inclination θ1 corresponds to an angle formed between a tangential line of the reflective surface M2 at the first position P1 or the second position P2 as shown in FIG. 4 and the upper surface LGA. Further, the second angle of inclination θ2 is an angle formed between the reflective surface M3 and the upper surface LGA, and when a cross-section of the reflective surface M3 is curved, the second angle of inclination θ2 corresponds to an angle formed between a tangential line of the reflective surface M3 at the third position P3 or the fourth position P4 as shown in FIG. 4 and the upper surface LGA.

FIG. 6 is an illustration for explaining an example of the first angle of inclination which the second reflector R2 forms with the lightguide LG in the cross-sectional view shown in FIG. 4.

In terms of the first angle of inclination θ1 which the second reflector R2 forms with the upper surface LGA, the example illustrated corresponds to a case where angle θ12 at the second position P2 is greater than angle θ11 at the first position P1. The first angle of inclination θ1 is gradually increased from a position close to the light-emitting layer FL to a position close to the projection PT.

Figure 7:
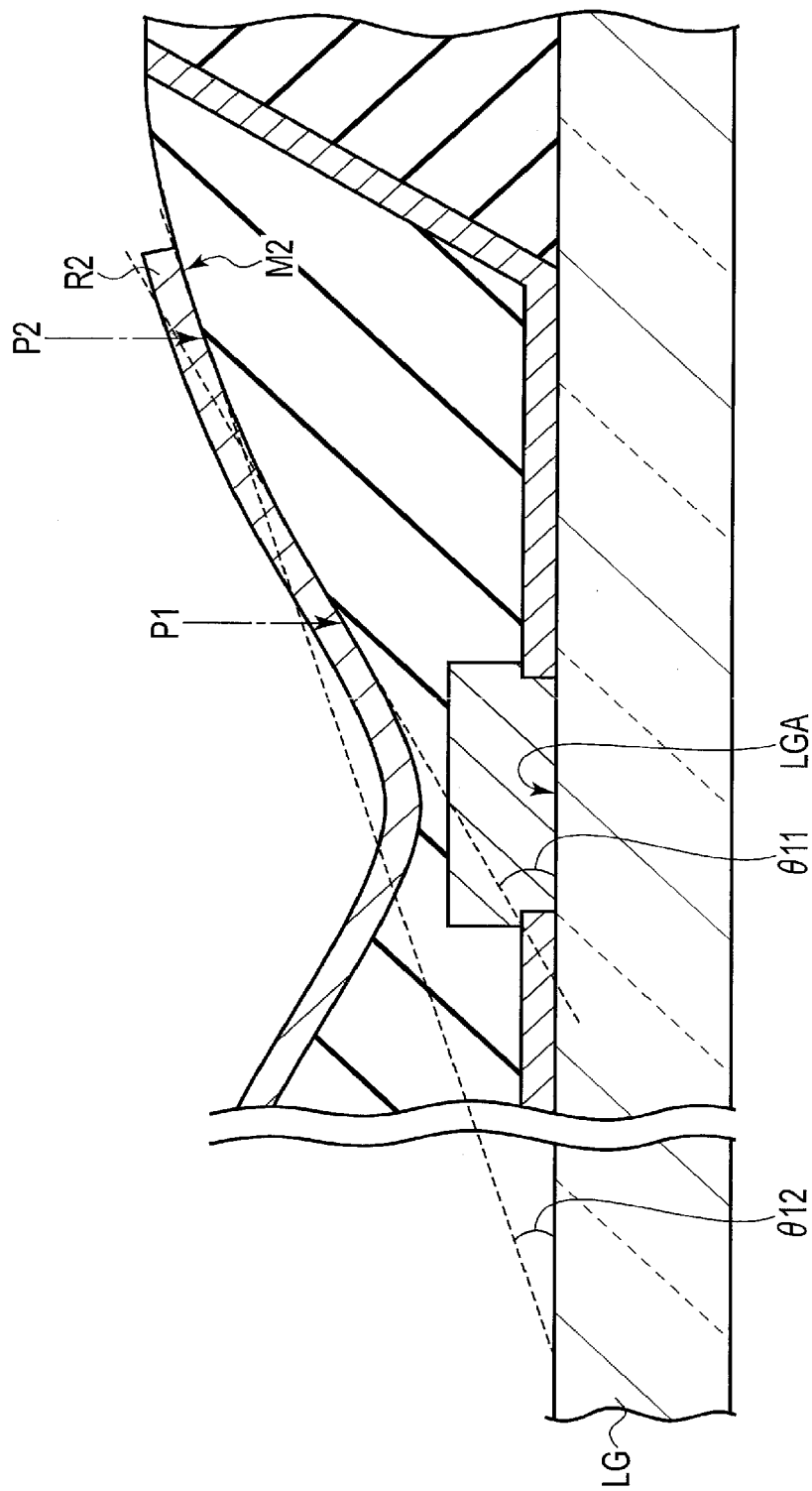
FIG. 7 is an illustration for explaining another example of the first angle of inclination which the second reflector R2 forms with the lightguide LG in the cross-sectional view shown in FIG. 4.

FIG. 7 is an illustration for explaining another example of the first angle of inclination which the second reflector R2 forms with the lightguide LG in the cross-sectional view shown in FIG. 4.

In terms of the first angle of inclination θ1 which the second reflector R2 forms with the upper surface LGA, the example illustrated corresponds to a case where angle θ12 at the second position P2 is smaller than angle θ11 at the first position P1. The first angle of inclination θ1 is gradually decreased from a position close to the light-emitting layer FL to a position close to the projection PT.

Next, referring to FIG. 3, the operation of the illumination device IL will be described.

The light emitted from the light source LS enters from the side surface LGC, and is guided through the inside of the lightguide LG by the reflection at the upper surface LGA and the lower surface LGB of the lightguide LG. Of the light which has reached the upper surface LGA of the lightguide LG, light which has entered the opening OP excites the emitting material of the light-emitting layer FL, and is subjected to wavelength conversion. The light-emitting layer FL emits light having a wavelength different from that of the incident light. Since the light-emitting layer FL emits light isotropically, while part of the light returns to the lightguide LG through the opening OP, most of the light is reflected multiple times between the first reflector R1 and the second reflector R2. As described above, the first reflector R1 and the second reflector R2 are nonparallel, and a distance between the two is gradually increased toward the projection PT. Accordingly, the light emitted from the light-emitting layer FL proceeds toward the projection PT while the multiple reflection is repeatedly performed, and the traveling direction also converges to a direction sandwiched between the first reflector R1 and the second reflector R2. After that, the light reflected by the first reflector R1 or the second reflector R2 is reflected in the direction substantially parallel to the third direction Z in the third reflector R3, and is emitted to the outside of the structure ST of the light radiation portion through the emission portion LE.

As can be seen, according to the present embodiment, as light emitted from the light-emitting layer FL is reflected multiple times between the first reflector R1 and the second reflector R2 which are not parallel, the directions in which the light travels can be converted from directions which are isotropic to directions within a predetermined angular range. Since the light within the predetermined angular range is reflected by the third reflector R3, the traveling direction becomes substantially parallel to the third direction Z, and most of the light is emitted to the outside from the emission portion LE which is located directly above the reflective surface M3 of the third reflector R3. Accordingly, the light extraction efficiency can be improved. Consequently, power consumption of the light source LS for obtaining predetermined brightness can be reduced. Also, according to the present embodiment, since a structure in which the emission light from the light source LS is entered from the side surface LGC of the lightguide LG is adopted, as compared to a structure in which the light source LS is arranged on the side opposed to the lower surface LGB of the lightguide LG, the device can be made slim.

In order to further enhance the light extraction efficiency, preferably, the light which enters the third reflector R3 should preferably be one falling within a range of small angle of incidence. In order to realize this, it is necessary to increase the number of times of multiple reflection by satisfying both the nonparallel state of the first reflector R1 and the second reflector R2, and also the reduction of an angle formed therebetween. Meanwhile, the first reflector R1 and the second reflector R2 are formed of aluminum, for example, and the reflectance is approximately 85 to 90%. Therefore, in order to enhance the light extraction efficiency, the number of times of reflection should preferably be reduced.

As a result of various studies conducted by the inventors, it has been confirmed that an angle between the first reflector R1 and the second reflector R2 for enhancing the light extraction efficiency is within the range of 10 to 40 degrees, for example, and more preferably, within the range of 20 to 30 degrees. Note that the angle described above corresponds to an angle formed between the reflective surface M1 of the first reflector R1 and the reflective surface M2 of the second reflector R2, and when it is assumed that the reflective surface M1 is parallel to the upper surface LGA, the angle is equal to the first angle of inclination θ1 shown in FIG. 5.

As compared to the example shown in FIG. 6, with the example shown in FIG. 7, an advantage of satisfying both the collimating properties and light extraction efficiency can be obtained. That is, in the example illustrated in FIG. 7, since the first angle of inclination θ1 is relatively large in the portion near the light-emitting layer FL, the light emitted from the light-emitting layer FL is reflected a fewer number of times, and attenuation by the reflection is suppressed. After that, although the reflected light reaches a portion separated from the light-emitting layer FL, since the first angle of inclination θ1 is relatively small in this portion, an angle of light which enters the third reflector R3 can be made small. Accordingly, the example illustrated in FIG. 7 is more advantageous than the example illustrated in FIG. 6.

Figure 8:
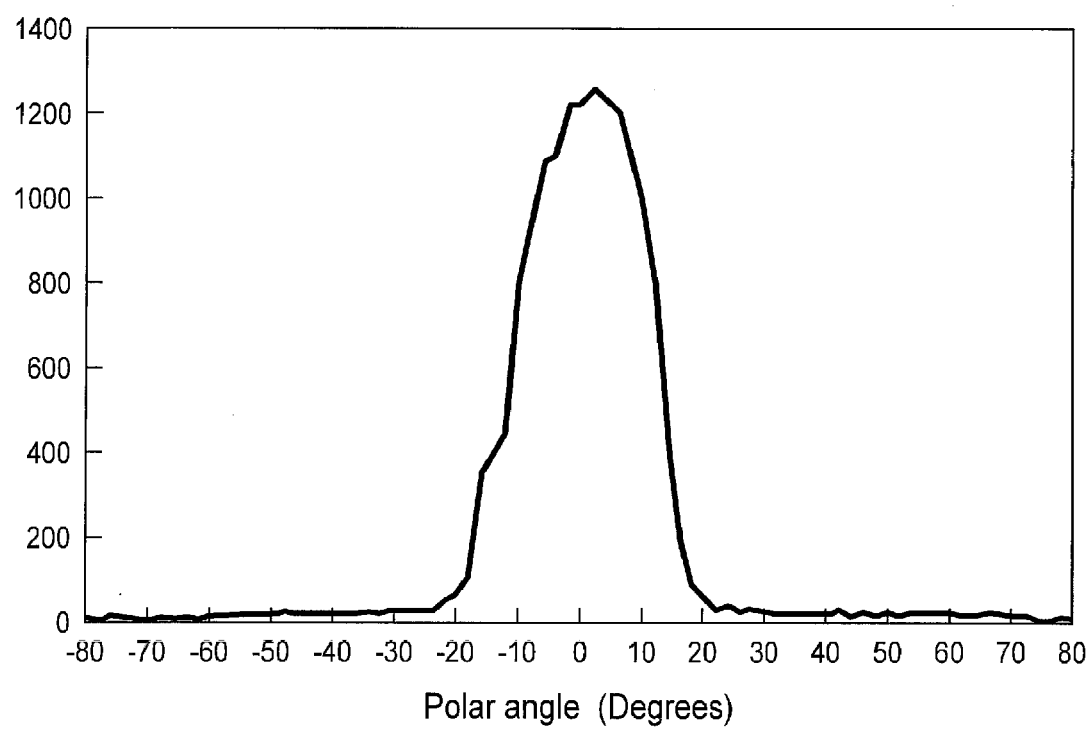
FIG. 8 is a graph showing an angle distribution of emission intensity in the illumination device IL of the present embodiment.

FIG. 8 is a graph showing an angle distribution of emission intensity in the illumination device IL of the present embodiment.

Here, an angle formed between the first reflector R1 and the second reflector R2 is set to approximately 20 degrees on the average, an average distance between the first reflector R1 and the second reflector R2 is set to 5 μm, and the size of the structure ST of the light radiation portion LP in the planar view is made fivefold the average distance between the first reflector R1 and the second reflector R2. When a polar angle is defined assuming that the third direction Z is 0 degrees, the maximum of emission intensity appears at the polar angle of 2 degrees, the angle distribution is substantially symmetrical, and the half width is 23 degrees. As can be seen, it could be confirmed that majority of light is emitted in directions close to the third direction Z.

Also, an integrating-sphere photometer was used to evaluate the light extraction efficiency. First, only the light source LS was installed in the integrating-sphere photometer and lighted, the brightness on the wall surface of the integrating-sphere photometer was measured, and this was treated as 100% brightness. Next, when the above illumination device IL was structured by arranging the light source LS on the side surface of the lightguide LG, installed within the integrating-sphere photometer, and lighted, and then the brightness on the wall surface of the integrating-sphere photometer was measured, it has been found that the brightness level was 41% as compared to the case where only the light source LS was installed and lighted. Since the internal quantum efficiency of phosphors included in the light-emitting layer FL is 80%, when the brightness level is divided by this percentage, it is understood that the light extraction efficiency is 51%. As can be seen, a planar illumination device IL excellent in the collimating properties and light extraction efficiency can be obtained.

FIG. 9 shows cross-sectional views each showing a structure ST of a comparative example.

The comparative example shown in FIG. 9 (A) is different from the structure example shown in FIGS. 3 and 4 in that the size of the second reflector R2 is smaller than the size of the first reflector R1, and a second end portion E2 is located more to the inner side than a position directly above a first end portion E1. The comparative example shown in FIG. 9 (B) is different from the structure example shown in FIGS. 3 and 4 in that an optical propagation layer MR is arranged continuously to the adjacent structure ST extending over a projection PT. In these comparative examples, light reflected by the first reflector R1 yields a component that is emitted from an emitting portion LE without being incident on a third reflector R3. For this reason, in order to ensure that the majority of light is emitted in the direction close to the third direction Z, preferably, the second end portion E2 of the second reflector R2 should be located directly above the first end portion E1 of the first reflector R1, or to the outer side than a position directly above the first end portion E1, and the optical propagation layer MR should not extend over the projection PT.

Figure 10:
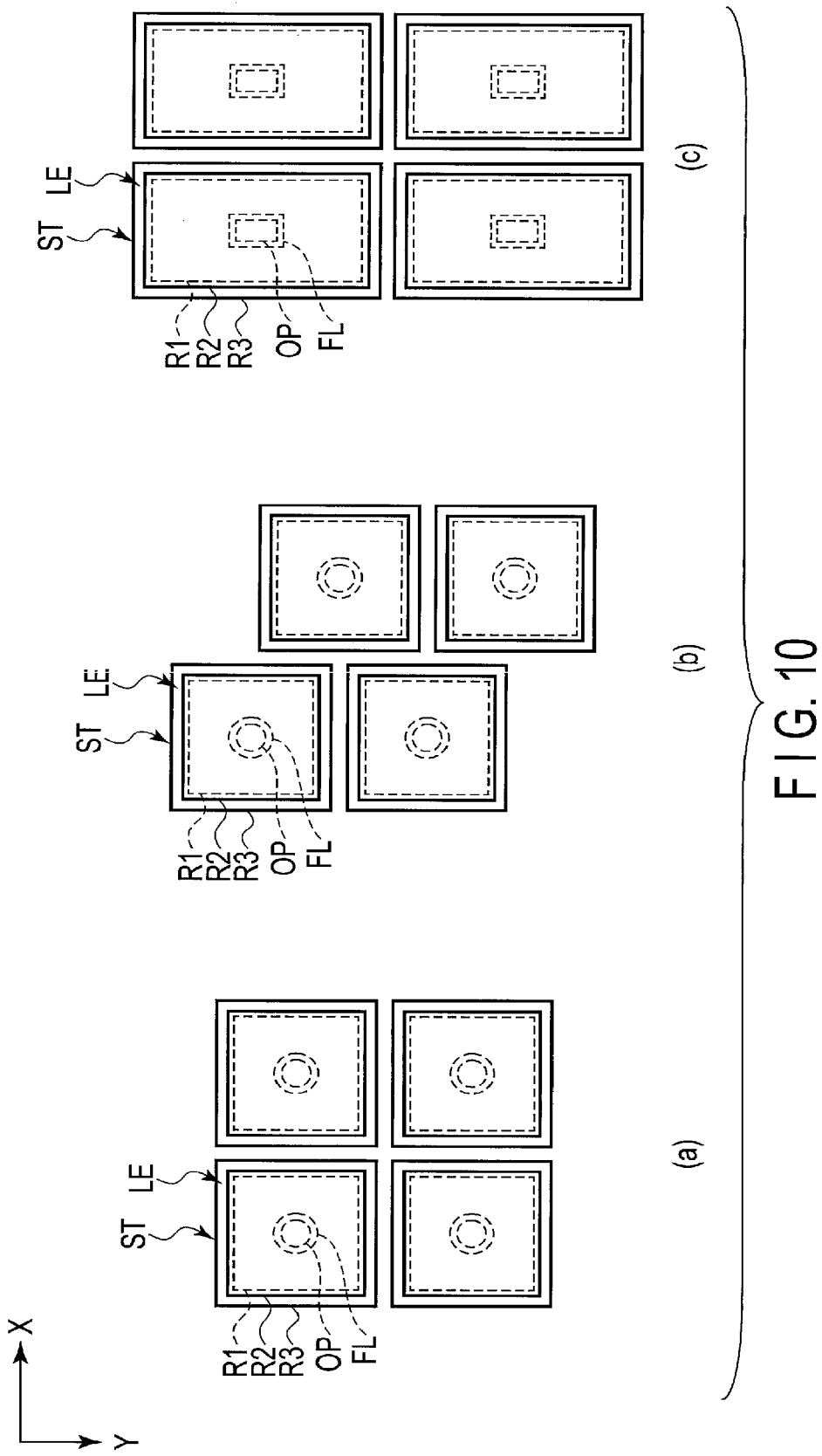
FIG. 10 shows plan views each showing another structure example of the structure ST applicable to the light radiation portion LP shown in FIG. 1.
Figure 11:
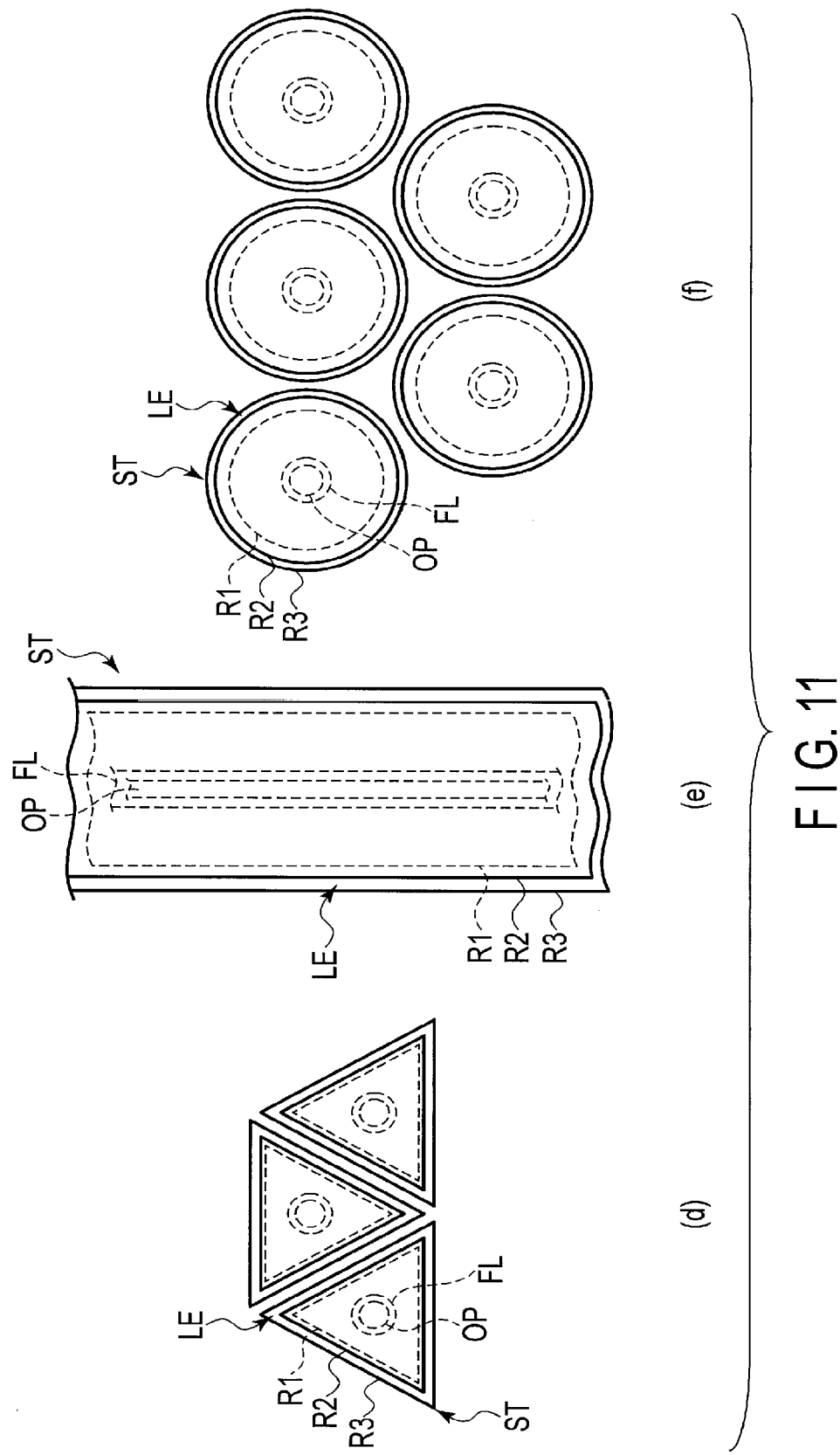
FIG. 11 shows plan views each showing yet another structure example of the structure ST applicable to the light radiation portion LP shown in FIG. 1.

FIGS. 10 and 11 show plan views each showing another structure example of the structure ST which can be applied to the light radiation portion LP shown in FIG. 1. Note that the same structural elements as those of the structure example illustrated in FIG. 2 will be designated by the same reference numbers, and explanations of them will be omitted.

FIG. 10 (*a*) corresponds to a structure example in which the structures ST are arranged to be adjacent to each other in the first direction X and the second direction Y. FIG. 10 (*b*) corresponds to a structure example in which the structures ST are arranged in a staggered configuration. In either of the structure examples, each of the structures ST is formed in a square shape. In addition, each of the first reflector R1, the second reflector R2, and the third reflector R3 is formed in a square shape. FIG. 10 (*c*) corresponds to a structure example in which the structures ST are arranged to be adjacent to each other in the first direction X and the second direction Y, and each of the structures ST is formed in a rectangular shape extended more in the second direction Y than the first direction X. FIG. 11 (*d*) corresponds to structure example in which each of the structures ST is formed in a triangular shape. FIG. 11 (*e*) corresponds to a structure example in which the structure ST is formed in a stripe shape extending in the second direction Y. FIG. 11 (*f*) corresponds to a structure example in which the structure ST is formed in a circular shape. In each of the structure examples shown in FIG. 10 (*a*) to (*c*) and FIG. 11 (*d*) to (*f*), the opening OP is located at substantially the center of the structure ST, and the light-emitting layer FL overlaps the opening OP.

In the X-Y plane, when it is required to increase the occupation of the emission portion LE as much as possible, preferably, the triangular structure ST as shown in FIG. 11 (*d*) should be applied. Also, when it is required to obtain the optimum light extraction efficiency and collimating properties by making a distance between the opening OP and the emission portion LE constant, preferably, the hexagonal structure ST as shown in FIG. 2 should be applied. Further, when it is required to make a distance between the opening OP and the emission portion LE even more constant, preferably, the circular structure ST shown in FIG. 11 (*f*) should be applied. Note that the structure examples illustrated can be combined arbitrarily. That is, for example, the hexagonal structure ST shown in FIG. 2 can be combined with the triangular structure ST shown in FIG. 11 (*d*) or the circular structure ST shown in FIG. 11 (*f*).

Further, in the present embodiment, either of an organic phosphor and an inorganic phosphor is applicable to the light-emitting layer FL. Since the organic phosphor is transparent, multiple reflection can be performed in a portion where the first reflector R1 and the second reflector R2 overlap the light-emitting layer FL in the planar view, and this is advantageous in light extraction. Apart from the above, quantum dots or quantum rods can be applied to the light-emitting layer FL. Not only are these elements transparent, but control of a fluorescent wavelength is easy, and the half width of fluorescence is narrow, so they are advantageous in color purity enhancement. In particular, since the quantum rod has a feature that Stokes shift is large and resorption is small, the internal quantum efficiency is not easily reduced even if the quantum rods are provided densely. Accordingly, if the quantum rods are used for the light-emitting layer FL, since the light-emitting layer FL can be made thin, it is possible to make the entirety of the light radiation portion LP slim and small in size.

Next, another example of the structure of the present embodiment will be described.

FIG. 12 is a cross-sectional view showing another structure example of the structure ST shown in FIG. 2 taken along line A-B.

The structure example shown in FIG. 12 is different from the structure example shown in FIG. 3 in that a diffusion layer DL is provided over the emission portion LE. In the example illustrated, although the diffusion layer DL is arranged on the second reflector R2, in order to diffuse the emission light from the structure ST, it suffices that the diffusion layer DL is arranged on at least the emission portion LE. The diffusion layer DL is composed by combining two or more kinds of materials whose refractive indexes are different. For example, the diffusion layer DL may be acrylic resin in which silica gel particles are dispersed, and is constituted of transparent resin of a low refractive index in which particles of a high refractive index are dispersed. Such a diffusion layer DL has the function of increasing the angle distribution of light emitted from the emission portion LE. Accordingly, regularity of a planar distribution of the emission light of the light radiation portion LP can be moderated, and even if the light radiation portion LP is overlaid on an element having a regular pattern, moiré can be reduced.

FIG. 13 is a cross-sectional view showing yet another structure example of the structure ST shown in FIG. 2 taken along line A-B.

The structure example shown in FIG. 13 is different from the structure example shown in FIG. 3 in that a fourth reflector R4 is provided between the lightguide LG and the projection PT. The fourth reflector R4 is disposed on the upper surface LGA, and in the example illustrated, the fourth reflector R4 is connected to the first reflector R1. Accordingly, the upper surface LGA is covered with the first reflector R1 and the fourth reflector R4 except for the opening OP. The fourth reflector R4 can be formed of the same material as that of the first reflector R1, etc.

Although the light from the light source LS is propagated within the lightguide LG while being reflected multiple times, entry of light inside the projection PT is suppressed at this time. Accordingly, the propagation efficiency of light within the lightguide LG can be improved. In this way, since the amount of light which enters the light-emitting layer FL can be increased through the opening OP, an advantage of increasing the brightness of the illumination device can be obtained.

FIG. 14 is a cross-sectional view showing yet another structure example of the structure ST shown in FIG. 2 taken along line A-B.

The structure example shown in FIG. 14 is different from the structure example shown in FIG. 3 in that an alignment film AR is provided between the lightguide LG and the light-emitting layer FL. As shown in the enlarged view of FIG. 14, phosphors FM in the light-emitting layer FL are arranged in a normal direction of the lightguide LG. In FIG. 14, an average distribution direction of dipoles DP in the light-emitting layer FL is shown by a thick double-headed arrow. More specifically, the alignment film AR is applied to a surface including the opening OP to perform an alignment treatment, then a mixture of liquid crystal, photoreactive liquid crystal, and the phosphors FM is applied thereon, and after that, light is irradiated selectively on the opening OP or a portion including the opening OP to further polymerize the photoreactive liquid crystal and produce a high polymer MM. After that, by using a solvent, etc., cleansing was performed to remove the unreacted mixture, then the light-emitting layer FL was patterned. In most cases, the dipoles DP of the phosphors FM are oriented in the molecular long axis direction of the phosphors FM, and the phosphors FM are aligned such that their molecular long axes are parallel to the alignment direction of the liquid crystal. Therefore, by applying a vertical alignment film to the alignment film AR, the light-emitting layer FL in which the dipoles DP of the phosphors FM are arranged in the normal direction can be obtained. Also, by applying a vertical alignment film to the alignment film AR, no special alignment treatment is necessary. While the alignment film AR is at a lower layer of the light-emitting layer FL, since the liquid crystal layer tends to be vertically aligned at an air interface, the vertical alignment in the upper part of the light-emitting layer FL can be realized by utilizing alignment properties at such an air interface.

Note that it is sufficient if the alignment film AR is disposed at least beneath the light-emitting layer FL, and the alignment film AR which is located between the first reflector R1 and the optical propagation layer MR, and between the third reflector R3 and the optical propagation layer MR may be omitted.

In order to allow the phosphors FM to be aligned in the liquid crystal, it suffices that the phosphors FM are low molecular and have anisotropy in the shape, and thus, an organic phosphor or a quantum rod is suitable as the phosphors FM. Further, acrylic liquid crystal is suitable as the photoreactive liquid crystal, at least a part of a molecular end includes an acrylic group, and the acrylic groups are bound by light and formed as the high polymer MM. If the photoreactive liquid crystal exhibits liquid crystallinity at room temperature, the mixture of liquid crystal, photoreactive liquid crystal, and phosphors may be replaced with a mixture of photoreactive liquid crystal and phosphors. Alternatively, even if the photoreactive liquid crystal is in a solid phase at room temperature, when the photoreactive liquid crystal exhibits liquid crystallinity if mixed with a suitable solvent, the mixture of liquid crystal, photoreactive liquid crystal, and phosphors may be replaced with a mixture of a solvent, photoreactive liquid crystal, and phosphors.

The phosphors tend to emit fluorescence in the perpendicular direction of the dipoles DP. According to this structure example, since the dipoles DP are arranged in the normal direction of the first reflector R1, a fluorescent component which proceeds in the direction of the substrate plane is increased. As a result, a fluorescent component which is emitted with a fewer number of times of reflection is increased, and an advantage of improving both the collimating properties and light extraction efficiency can be obtained.

FIG. 15 is a cross-sectional view showing yet another structure example of the structure ST shown in FIG. 2 taken along line A-B.

The structure example shown in FIG. 15 is different from the structure example shown in FIG. 3 in that an optical absorption layer AB is provided on a top part of the third reflector R3 and the second reflector R2. Accordingly, the entire surface excluding the emission portion LE is covered with the optical absorption layer AB. The optical absorption layer AB may be resin including a pigment or a dye, or an inorganic film such as titanium nitride or manganese nitride. The optical absorption layer AB absorbs external light incident on the top part of the third reflector R3 and the second reflector R2. In this way, it is possible to reduce undesired reflection at the top part of the third reflector R3 and the second reflector R2.

Figure 16:
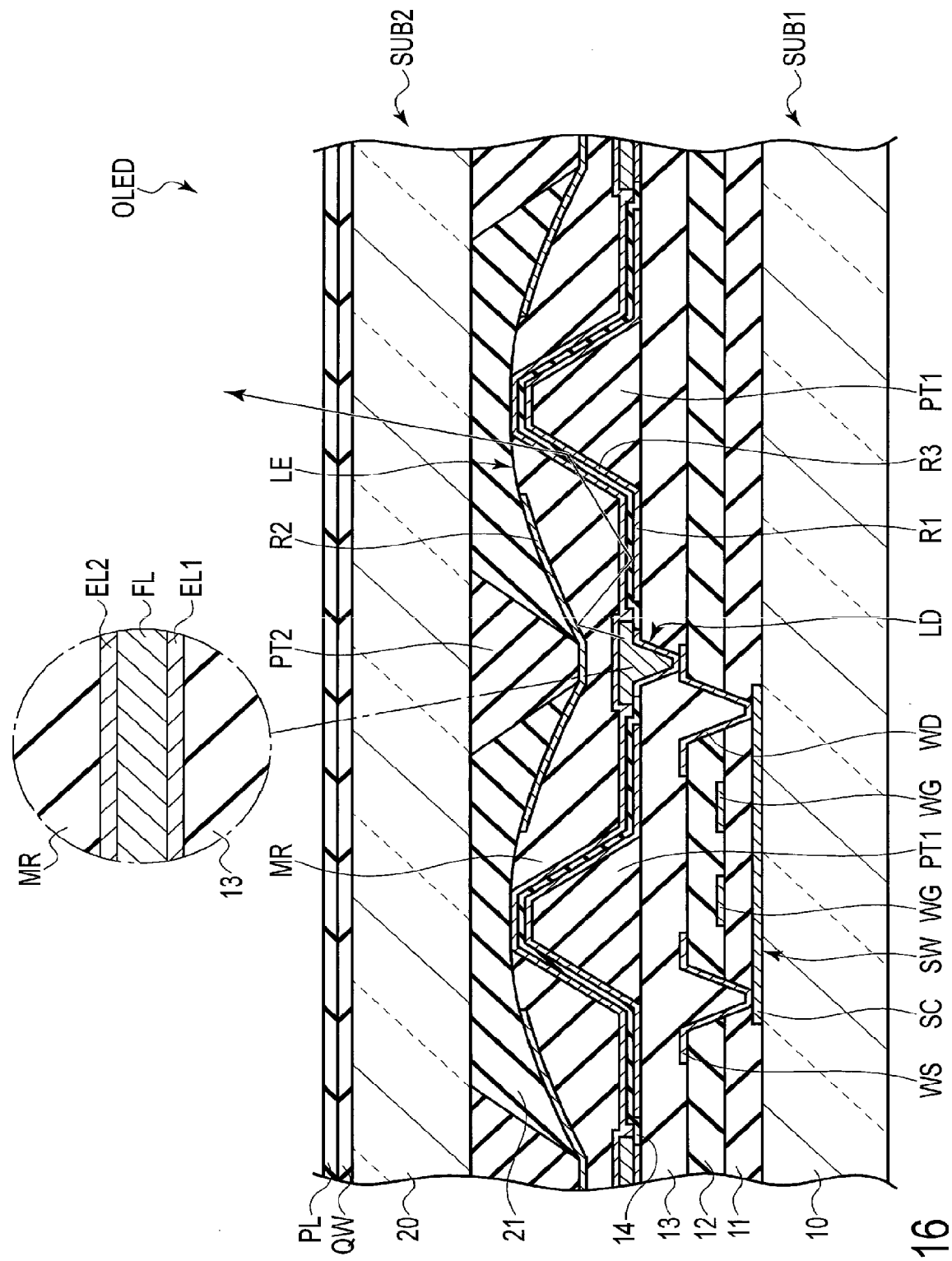
FIG. 16 is a cross-sectional view showing an example of a structure of an organic electroluminescent device OLED of the present embodiment.

FIG. 16 is a cross-sectional view showing an example of a structure of an organic electroluminescent device OLED of the present embodiment.

The organic electroluminescent (EL) device OLED includes a first substrate SUB1 and a second substrate SUB2.

The first substrate SUB1 includes a first insulating substrate 10, a first insulating film 11, a second insulating film 12, a third insulating film 13, a fourth insulating film 14, a switching element SW, a light-emitting element LD, the first reflector R1, the third reflector R3, a projection PT1 corresponding to a first projection, etc. The first insulating film 11 is disposed on the first insulating substrate 10, the second insulating film 12 is disposed on the first insulating film 11, and the third insulating film 13 is disposed on the second insulating film 12.

The switching element SW includes a semiconductor layer SC, a gate electrode WG, a source electrode WS, and a drain electrode WD. The semiconductor layer SC is disposed between the first insulating substrate 10 and the first insulating film 11, the gate electrode WG is disposed between the first insulating film 11 and the second insulating film 12, and the source electrode WS and the drain electrode WD are disposed between the second insulating film 12 and the third insulating film 13.

The light-emitting element LD is an organic electroluminescent light-emitting element, and is disposed on the third insulating film 13. The light-emitting element LD includes a first electrode EL1, the light-emitting layer FL, and a second electrode EL2. The first electrode EL1 is disposed on the third insulating film 13, and is electrically connected to the switching element SW. The light-emitting layer FL is located on the first electrode EL1. The light-emitting layer FL may include an electron-transport layer, an electron-injection layer, a hole-transport layer, a hole-injection layer, and the like. The second electrode EL2 is located on the light-emitting layer FL. The second electrode EL2 is formed of a transparent conductive material such as indium tin oxide (ITO) or indium zinc oxide (IZO). The color of light emitted from the light-emitting element LD may be white, or red, green or blue, for example.

The first reflector R1, the third reflector R3, and the projection PT1 are disposed on the third insulating film 13. The first reflector R1 is located in the same layer as the first electrode EL1, but is separated from the first electrode EL1. The fourth insulating film 14 is disposed on the first reflector R1 and the third reflector R3. Also, the fourth insulating film 14 is disposed on the third insulating film 13 between the first reflector R1 and the first electrode EL1. The second electrode EL2 of the light-emitting element LD is also disposed on the fourth insulating film 14. That is, the fourth insulating film 14 corresponds to an interlayer insulating film disposed between the first reflector R1 and the second electrode EL2, and between the third reflector R3 and the second electrode EL2.

The second substrate SUB2 includes a second insulating substrate 20, an insulating film 21, a projection PT2 corresponding to a second projection, the second reflector R2, etc. The first insulating substrate 10 and the second insulating substrate 20 are formed of glass such as borosilicate glass, or resin such as plastic. The insulating film 21 and the projection PT2 are disposed under the second insulating substrate 20, that is, on the side opposed to the first substrate SUB1. The light-emitting element LD is positioned directly under the projection PT2. The insulating film may be transparent, or may be constituted by a color filter. The second reflector R2 is disposed under the insulating film 21 and the projection PT2, and above the light-emitting element LD, the first reflector R1, and the third reflector R3. The optical propagation layer MR is disposed in a gap between the first substrate SUB1 and the second substrate SUB2.

Note that although detailed explanation is omitted here, the structure described referring to FIG. 3, etc., is applicable to the structures of the first reflector R1, the second reflector R2, and the third reflector R3, and the emission portion LE is formed between the second reflector R2 and the third reflector R3. The emission portion LE is located between the projection PT1 and the projection PT2, and is arranged closer to the projection PT1 than to the projection PT2.

Such an organic EL device OLED can be applied as an illumination device or a display device. When the organic EL device OLED is applied as a display device, a retardation film QW and a polarizer PL should preferably be arranged on the second substrate SUB2. In the example illustrated, the retardation film QW is a quarter-wave plate, and is disposed on the second insulating substrate 20. The polarizer PL is disposed on the retardation film QW. A laminate composed of the retardation film QW and the polarizer PL absorbs external light reflected by the second reflector R2 and the third reflector R3 of the external light incident on the second substrate SUB2 from the outside. Thus, even if the organic EL device OLED is used in an environment in which the surrounding is bright, a reduction of the contrast ratio by the external light reflection can be suppressed, and deterioration in display quality can be suppressed.

Figure 17:
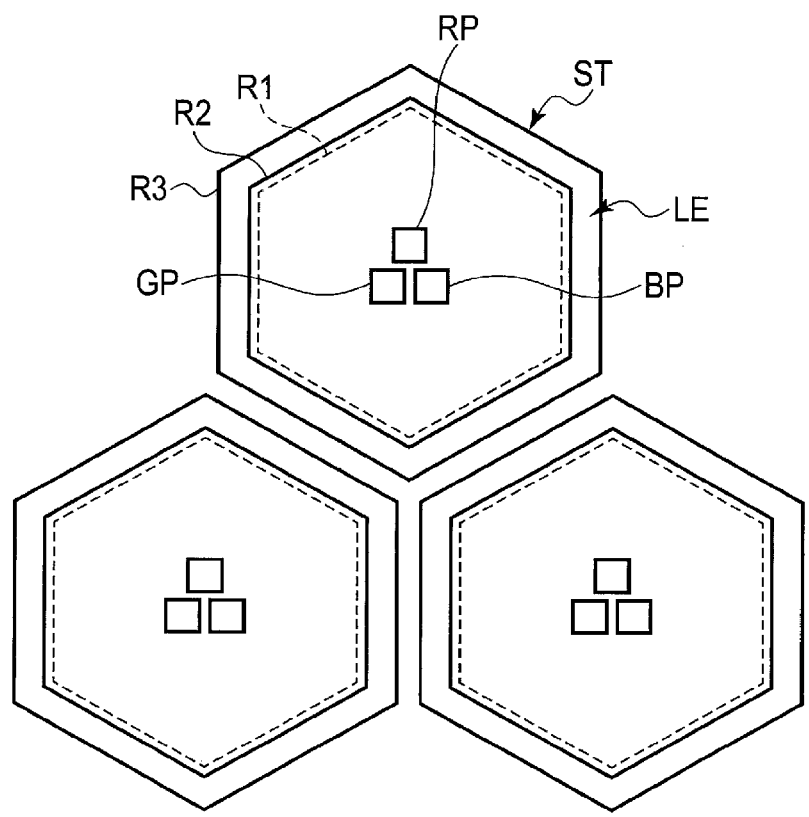
FIG. 17 is an illustration showing an arrangement example of a red light-emitting pixel RP, a green light-emitting pixel GP, and a blue light-emitting pixel BP.

When the organic EL device OLED is applied as a display device, the light-emitting element LD as illustrated is arranged in each of a red light-emitting pixel RP, a green light-emitting pixel GP, and a blue light-emitting pixel BP, and the light-emitting elements LD are configured to emit light colored red, green, and blue, respectively. In one example, the red light-emitting pixel RP, the green light-emitting pixel GP, and the blue light-emitting pixel BP are arranged in the structures ST, respectively. Alternatively, as shown in FIG. 17, three light-emitting pixels RP, GP, and BP whose luminescent colors are different may be arranged in one structure ST. In this case, by arranging the three light-emitting pixels RP, GP, and BP such that they are close to the center of the structure ST as much as possible, a distance between the light-emitting pixel and the third reflector R3 can be approximated to the same distance for all of the light-emitting pixels, and azimuthal dependence of the distance between the light-emitting pixel and the third reflector R3 for all of the light-emitting pixels can be approximated to be uniform. In this way, the observation angle characteristics of the respective colors can be uniformed, and observation angle dependency of color chromaticity when, for example, all colors are lit to perform white display can be resolved.

FIG. 18 is a perspective view showing an example of a structure of a liquid crystal device LCD of the present embodiment. FIG. 18 (a) is a perspective view of the liquid crystal device LCD, (b) is a perspective view of a surface of a second substrate SUB2 which is opposed to a first substrate SUB1, and (c) is a perspective view of a surface of the first substrate SUB1 which is opposed to the second substrate SUB2.

The liquid crystal device LCD includes, for example, the light source LS, the first substrate SUB1, the second substrate SUB2, and a liquid crystal layer LC not shown. The first substrate SUB1 also serves as the lightguide LG as described above, and includes the light radiation portion LP. A display area DA is an area for displaying an image, and is opposed to the light radiation portion LP. The second substrate SUB2 includes a peripheral drive circuit PS and a connector CN in a non-display area NDA around the display area DA. The connector CN includes a terminal for connecting signal supply sources such as a flexible printed circuit and an IC chip.

Figure 19:
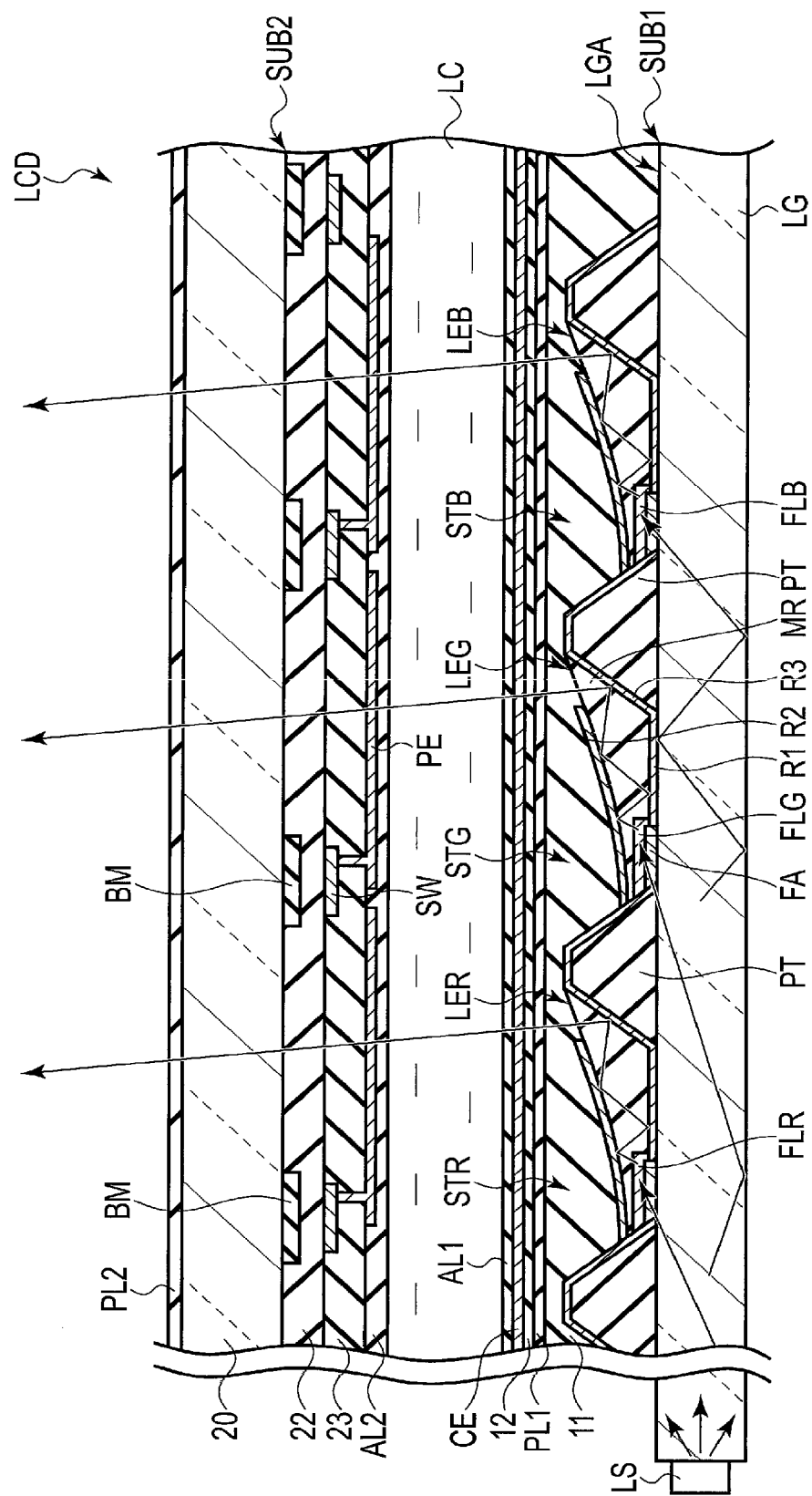
FIG. 19 is a cross-sectional view showing an example of the structure of the liquid crystal device LCD shown in FIG. 18.

FIG. 19 is a cross-sectional view showing an example of the structure of the liquid crystal device LCD shown in FIG. 18.

The first substrate SUB1 includes the lightguide LG, structures STR, STG, and STB, the first insulating film 11, a first polarizer PL1, the second insulating film 12, a common electrode CE, a first alignment film AL1, etc. The first insulating film 11 is disposed on the structures STR, STG, and STB, the first polarizer PL1 is disposed on the first insulating film 11, the second insulating film 12 is disposed on the first polarizer PL1, the common electrode CE is disposed on the second insulating film 12, and the first alignment film AL1 is disposed on the common electrode CE. The structures STR, STG, and SIB are elements which emit red, green and blue light, respectively. The structures STR, STG, and STB include light-emitting layers FLR, FLG, and FLB, and emission portions LER, LEG, and LEB, respectively, and the other structural elements are the same as those already described. Here, taking the structure STG as an example, the structure will be specifically described. The structure STG includes, on the lightguide LG, an optical absorption layer FA, a light-emitting layer FLG, the first reflector R1, the second reflector R2, the third reflector R3, the optical propagation layer MR, the projection PT, etc. The optical absorption layer FA is positioned between the lightguide LG and the light-emitting layer FLG. The optical absorption layer FA transmits light from the light source LS, and absorbs light emitted from the light-emitting layer FLG. In one example, the optical absorption layer FA is a blue color filter. The optical absorption layer FA absorbs a component of light which proceeds to the lightguide LG of the light emitted by the light-emitting layer FLG. Therefore, it is possible to suppress entry of light emitted by the light-emitting layer of a certain color into the structure which emits the other color, and reduction of color purity caused by color mixture can be suppressed.

The structures described referring to FIG. 3, etc., are applicable to the structures of the first reflector R1, the second reflector R2, and the third reflector R3. However, each of the structures STR, STG, and STB of the example illustrated in FIG. 19 is different from the structure example shown in FIG. 3 in the shape of the optical propagation layer MR. That is, the light-emitting layer FL and the optical absorption layer FA are close to one of the projections PT, and the optical propagation layer MR has an asymmetrical film thickness distribution between the adjacent projections PT. More specifically, the film thickness of the optical propagation layer MR is the smallest on the light-emitting layer FL which is close to one of the projections PT, and monotonically increases toward the other projection PT. Here, one of the projections PT mentioned above corresponds to a first projection, and the other projection PT corresponds to a second projection. The emission portion LE is located close to the other projection PT, and mixture of light having different colors can thereby be suppressed.

The first insulating film 11 is disposed on the structures STR, STG, and STB, the first polarizer PL1 is disposed on the first insulating film 11, the second insulating film 12 is disposed on the first polarizer PL1, the common electrode CE is disposed on the second insulating film 12, and the first alignment film AL1 is disposed on the common electrode CE. The common electrode is made of a transparent conductive material such as ITO.

The second substrate SUB2 includes an insulating substrate 20, a light-shielding layer BM, a third insulating film 22, a fourth insulating film 23, the switching element SW, a pixel electrode PE, a second alignment film AL2, etc. The light-shielding layer BM and the third insulating film 22 are disposed below the insulating substrate 20, the fourth insulating film 23 is disposed below the third insulating film 22, the second alignment film AL2 is disposed below the fourth insulating film 23, the switching element SW is disposed directly under the light-shielding layer BM, and the pixel electrode PE is disposed between the fourth insulating film 23 and the second alignment film AL2. The light-shielding layer BM blocks external light proceeding toward the switching element SW or a conductive line, etc., which is electrically connected to the switching element SW of the external light incident on the second substrate SUB2 from the outside. As a result, not only can the optical leakage at the switching element SW be suppressed, but undesired dispersion or reflection at the conductive line can be suppressed.

A second polarizer PL2 is positioned outside the second substrate SUB2, and includes a film formed by stretching polymers containing dichroic dyes. The first polarizer PL1 is a wire-grid polarizer formed of a metal film having fine slits, and the slits are provided at intervals of 50 nm, for example. Apart from the above, a coating-type polarizer is applicable as the first polarizer PL1. Transparent axes of the first polarizer PL1 and the second polarizer PL2 have an orthogonal positional relationship in, for example, the X-Y plane.

Figure 20:
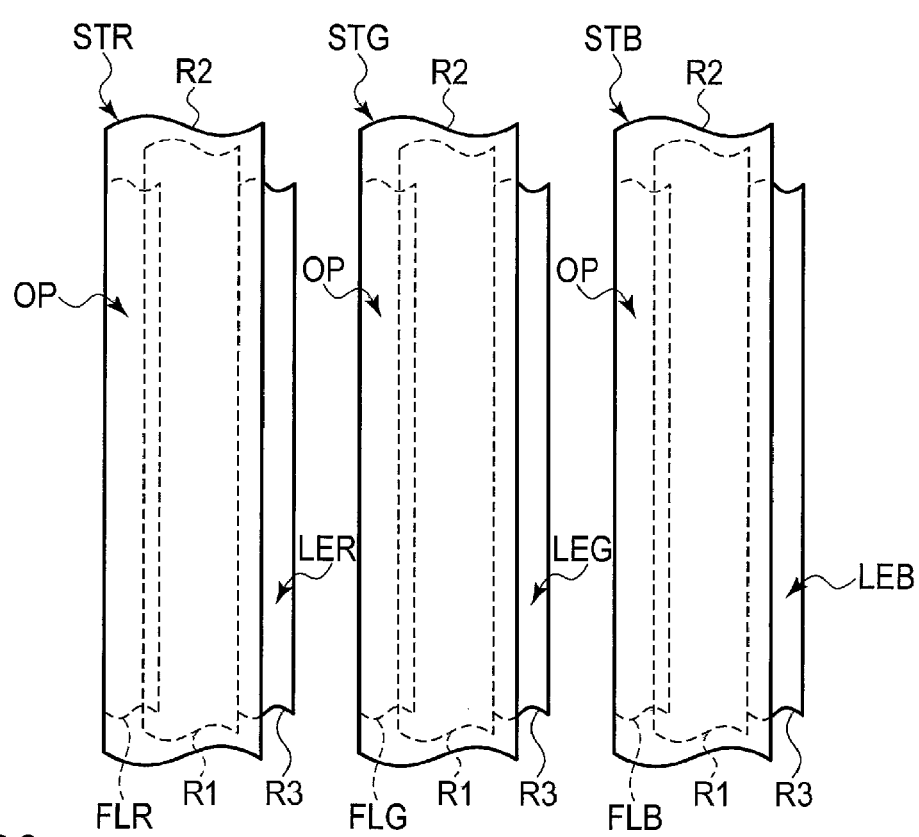
FIG. 20 is a plan view showing an example of the structure of the liquid crystal device LCD shown in FIG. 18.

FIG. 20 is a plan view showing an example of the structure of the liquid crystal device LCD shown in FIG. 18.

The structures STR, STG, and STB are repeatedly arranged to form a strip-shaped planar structure as shown in the drawing. The light-emitting layers FLR, FLG, and FLB are arranged to overlap strip-shaped openings OP, respectively. Strip-shaped emission portions LER, LEG, and LEB are formed in the structures STR, STG, and STB, respectively, between the corresponding second reflector R2 and the third reflector R3.

According to the liquid crystal device LCD of the above structure, since absorption by the color filter is not performed, the efficiency of use of light from the light source LS is improved, and brightness enhancement is enabled at low power consumption. Moreover, since a luminescent color of each light-emitting layer is directly observed, color purity can be enhanced.

Note that in the liquid crystal device LCD, the first substrate SUB1 comprising the light source LS and the light radiation portion LP serves as a planar light-emitting device, and the first polarizer PL1, the second polarizer PL2, the liquid crystal layer LC, and the second substrate SUB2 serve as an optical shutter which passes through or blocks light emitted by the planar light-emitting device. As the optical shutter, a non-emission type display element such as microelectromechanical systems (MEMS) can also be used apart from the above examples. In addition, while a blue light-emitting diode is used for the light source LS, an ultraviolet light source can also be used if an excitation wavelength range of the light-emitting layer FL is adjusted.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An illumination device comprising:
a light source;
a lightguide which includes an upper surface, and guides the light from the light source;
a light-emitting layer which is disposed on the upper surface, and emits light based on the light from the light source;
a first reflector disposed on the upper surface;
a second reflector located above the first reflector and the light-emitting layer at an interval; and
a third reflector which is located above the upper surface, and is more separated from the light-emitting layer than the first reflector,
a distance between the first reflector and the second reflector being greater at a second position farther from the light-emitting layer than at a first position closer to the light-emitting layer,
a distance between the lightguide and the third reflector being greater at a fourth position farther from the first reflector than at a third position closer to the first reflector,
an emission portion for allowing emission of light emitted from the light-emitting layer being formed between the second reflector and the third reflector.

2. The illumination device of claim 1, wherein:
the first reflector includes a first end portion located on a side separated from the light-emitting layer; and
the second reflector includes a second end portion located to be directly above the first end portion, or closer to the third reflector than a position directly above the first end portion.

3. The illumination device of claim 1, further comprising an optical propagation layer surrounded by the first to third reflectors, wherein
a maximum distance between the lightguide and the optical propagation layer is less than or equal to a maximum distance between the lightguide and the third reflector.

4. The illumination device of claim 1, wherein in a region in which the light-emitting layer and the second reflector face each other, a position at which a distance between the lightguide and the second reflector becomes the smallest exists.

5. The illumination device of claim 1, wherein:
the second and the third reflectors are inclined with respect to the upper surface; and
a first inclination angle between the second reflector and the upper surface is smaller than a second inclination angle between the third reflector and the upper surface.

6. The illumination device of claim 5, wherein the first inclination angle is greater at the second position than at the first position.

7. The illumination device of claim 5, wherein the first inclination angle is smaller at the second position than at the first position.

8. The illumination device of claim 1, further comprising a diffusion layer over the emission portion.

9. The illumination device of claim 1, further comprising a fourth reflector disposed on the upper surface of the lightguide, and a projection located on the fourth reflector.

10. The illumination device of claim 1, further comprising a vertical alignment film located between the lightguide and the light-emitting layer, wherein
the light-emitting layer includes phosphors arranged in a normal direction of the lightguide.

11. The illumination device of claim 1, further comprising an optical absorption layer located on the second reflector.

12. A display device comprising:
an insulating film;
a light-emitting element disposed on the insulating film;
a first reflector disposed on the insulating film;
a second reflector located above the first reflector and the light-emitting element at an interval; and
a third reflector which is located above the insulating film, and is more separated from the light-emitting element than the first reflector,
a distance between the first reflector and the second reflector being greater at a second position farther from the light-emitting element than at a first position closer to the light-emitting element,
a distance between the insulating film and the third reflector being greater at a fourth position farther from the first reflector than at a third position closer to the first reflector,
an emission portion for allowing emission of light emitted from the light-emitting element being formed between the second reflector and the third reflector.

13. The display device of claim 12, further comprising a switching element, wherein
the light-emitting element comprises:
a first electrode disposed on the insulating film, and electrically connected to the switching element;
a light-emitting layer disposed on the first electrode; and
a second electrode disposed on the light-emitting layer.

14. The display device of claim 13, further comprising an interlayer insulating film located between the first and third reflectors and the second electrode, wherein:

the first reflector is located in a same layer as the first electrode, and is separated from the first electrode; and
the interlayer insulating film is located between the first reflector and the first electrode.

15. The display device of claim 12, further comprising a first insulating substrate, a second insulating substrate, a first projection which protrudes from the first insulating substrate toward the second insulating substrate, and a second projection which protrudes from the second insulating substrate toward the first insulating substrate, wherein
the light-emitting element is located directly under the second projection; and
the emission portion is located between the first projection and the second projection, and is located closer to the first projection than to the second projection.

16. A display device comprising:
a light source;
a first substrate comprising a lightguide which includes an upper surface, and guides light from the light source, a light-emitting layer which is disposed on the upper surface, and emits light based on the light from the light source, a first reflector disposed on the upper surface, a second reflector located above the first reflector and the light-emitting layer at an interval, and a third reflector which is located above the upper surface, and is more separated from the light-emitting layer than the first reflector;
a liquid crystal layer disposed on the first substrate; and
a second substrate disposed on the liquid crystal layer, wherein
a distance between the first reflector and the second reflector being greater at a second position farther from the light-emitting layer than at a first position closer to the light-emitting layer,
a distance between the lightguide and the third reflector being greater at a fourth position farther from the first reflector than at a third position closer to the first reflector,
an emission portion for allowing emission of light emitted from the light-emitting layer being formed between the second reflector and the third reflector.

17. The display device of claim 16, wherein the second substrate further comprises a switching element and a pixel electrode electrically connected to the switching element.

18. The display device of claim 16, wherein:
the first substrate further comprises an optical absorption layer between the lightguide and the light-emitting layer; and
the optical absorption layer transmits light from the light source, and absorbs light emitted from the light-emitting layer.

19. The display device of claim 16, wherein:
the first substrate further comprises a first projection and a second projection disposed between the lightguide and the liquid crystal layer;
the emission portion and the light-emitting layer are located between the first projection and the second projection;
the emission portion is located closer to the second projection than to the first projection; and
the light-emitting layer is located closer to the first projection than to the second projection.

20. The display device of claim 19, further comprising an optical propagation layer surrounded by the first to third reflectors; and a film thickness of the optical propagation layer is smaller on a first side close to the first projection than on a second side close to the second projection.

\* \* \* \* \*